United States Patent
Shimizu et al.

(10) Patent No.: US 9,124,240 B2
(45) Date of Patent: Sep. 1, 2015

(54) ACOUSTIC WAVE DEVICE AND ANTENNA DUPLEXER EMPLOYING THE SAME

(75) Inventors: Hidehito Shimizu, Osaka (JP);
Hiroyuki Nakamura, Osaka (JP);
Takahiro Sato, Osaka (JP)

(73) Assignee: SKYWORKS PANASONIC FILTER SOLUTIONS JAPAN CO., LTD., Kadoma-Shi (JP)

( * ) Notice: Subject to any disclaimer, the term of this patent is extended or adjusted under 35 U.S.C. 154(b) by 137 days.

(21) Appl. No.: 13/807,070

(22) PCT Filed: Mar. 12, 2012

(86) PCT No.: PCT/JP2012/001682
§ 371 (c)(1),
(2), (4) Date: Dec. 27, 2012

(87) PCT Pub. No.: WO2012/140831
PCT Pub. Date: Oct. 18, 2012

(65) Prior Publication Data
US 2013/0099875 A1 Apr. 25, 2013

(30) Foreign Application Priority Data
Apr. 12, 2011 (JP) .................. 2011-088490

(51) Int. Cl.
*H03H 9/72* (2006.01)
*H03H 9/145* (2006.01)
*H03H 9/64* (2006.01)
(Continued)

(52) U.S. Cl.
CPC ............. *H03H 9/25* (2013.01); *H03H 9/14594* (2013.01); *H03H 9/6483* (2013.01); *H03H 9/725* (2013.01); *H03H 7/463* (2013.01)

(58) Field of Classification Search
CPC ..... H03H 7/463; H03H 9/14594; H03H 9/25; H03H 9/6483; H03H 9/725
USPC ........... 333/133, 193–196; 310/313 B, 313 D
See application file for complete search history.

(56) References Cited

U.S. PATENT DOCUMENTS

| 5,113,115 A | 5/1992 | Mariani |
| 5,895,996 A | 4/1999 | Takagi et al. |

(Continued)

FOREIGN PATENT DOCUMENTS

| JP | 7-283688 | 10/1995 |
| JP | 3216137 | 10/2001 |

(Continued)

OTHER PUBLICATIONS

International Search Report issued May 1, 2012 in corresponding International Application No. PCT/JP2012/001682.

*Primary Examiner* — Benny Lee
*Assistant Examiner* — Jorge Salazar, Jr.
(74) *Attorney, Agent, or Firm* — Lando & Anastasi, LLP

(57) ABSTRACT

The present invention is an acoustic wave device including first and second acoustic wave resonators. A first tilt angle that is an angle formed between a direction perpendicular to a direction in which electrode fingers of the first acoustic wave resonator extend and a direction along which the electrode fingers are arranged is different from a second tilt angle that is an angle formed between a direction perpendicular to a direction in which electrode fingers of the second acoustic wave resonator extend and a direction along which the electrode fingers are arranged.

20 Claims, 11 Drawing Sheets

(51) Int. Cl.
*H03H 9/25* (2006.01)
*H03H 7/46* (2006.01)

(56) References Cited

U.S. PATENT DOCUMENTS

| | | | |
|---|---|---|---|
| 2001/0008387 A1* | 7/2001 | Taniguchi | 333/193 |
| 2007/0090898 A1 | 4/2007 | Kando | |
| 2007/0274371 A1* | 11/2007 | Penavaire et al. | 374/117 |
| 2010/0207707 A1* | 8/2010 | Yata | 333/195 |
| 2011/0090026 A1 | 4/2011 | Nakahashi et al. | |
| 2011/0095845 A1 | 4/2011 | Fujiwara et al. | |
| 2012/0139653 A1* | 6/2012 | Owaki et al. | 331/163 |

FOREIGN PATENT DOCUMENTS

| | | |
|---|---|---|
| JP | 2007-104057 | 4/2007 |
| JP | 2009-290914 | 12/2009 |
| WO | 96/10293 | 4/1996 |
| WO | 2009/147787 | 12/2009 |
| WO | 2010/001522 | 1/2010 |

\* cited by examiner

ACOUSTIC WAVE DEVICE AND ANTENNA DUPLEXER EMPLOYING THE SAME

This application is a U.S. National Stage Application under 35 U.S.C. §371 of PCT Application Ser. No. PCT/JP2012/001682 filed on Mar. 12, 2012, which claims the benefit of priority to Japanese Patent Application Serial No. 2011-088490 filed on Apr. 12, 2011.

TECHNICAL FIELD

The present invention relates to an acoustic wave device and an antenna duplexer employing the same.

BACKGROUND ART

At present, filters employing surface acoustic wave devices have widely been used mainly for mobile phones and the like. In general, such a filter is composed of a resonator in which an IDT (comb-shaped electrode) and a reflector are provided on a piezoelectric substrate. In such a filter, characteristics required for the surface acoustic wave device depend on a frequency band and a system, and thus it is important to use a piezoelectric substrate suited to the frequency band and the system. Here, the frequency band and the pass band are greatly influenced by a surface acoustic wave velocity and an electromechanical coupling coefficient, and their characteristics largely depend on the material and cut angle of the piezoelectric substrate.

In the piezoelectric substrate, if there is no symmetry of crystal about the direction in which the wavefront of a surface acoustic wave propagates, the phenomenon called beam steering occurs in which the wavefront propagation direction (the direction of phase propagation) is different from the direction of energy travel. The angle formed between the wavefront propagation direction and the direction of energy travel is called power flow angle. If the power flow angle is high, an energy loss occurs and thus the filter characteristic may deteriorate. Therefore, using a cut angle at which the power flow angle is zero is considered, but optimal surface acoustic wave velocity and electromechanical coupling coefficient are not necessarily obtained with such a cut angle. For that reason, it is important how the loss is reduced in a state where there is beam steering.

As a filter that achieves this, a filter composed of a resonator as disclosed in Patent Literature 1 is proposed. FIG. 10 shows a top view of the filter 900. In the filter 900, a pair of IDT electrodes 901 and reflectors 902 are formed on a piezoelectric substrate 910. A plurality of electrode fingers 903 of each IDT electrode 901 are arranged so as to be parallel to each other such that the direction in which the electrode fingers 903 extend is orthogonal to an X axis that is the direction in which the wavefront of a surface acoustic wave propagates. In addition, the direction along which these electrode fingers 903 are arranged is the direction along an X' axis which is tilted relative to the X axis by a power flow angle $\zeta$. Furthermore, the reflectors 902 provided on both sides of the IDTs are arranged along the X' axis. Moreover, a plurality of conductor strips 904 constituting each reflector 902 are arranged so as to be parallel to each other such that the direction in which the conductor strips 904 extend is orthogonal to the X axis. Thus, intersection areas of the electrode fingers 903 and the reflectors 902 are arranged along the direction of energy travel, and hence the energy can be confined and the loss can be reduced.

CITATION LIST

Patent Literature

[PTL 1] Japanese Patent No. 3216137

SUMMARY OF THE INVENTION

Problems to be Solved by the Invention

However, in general, the power flow angle $\zeta$ is uniquely determined by the material and cut angle of the piezoelectric substrate. Thus, in the case where a filter having a plurality of resonators is configured by using a piezoelectric substrate having the power flow angle $\zeta$, the direction along which the electrode fingers of all the IDT electrodes and the conductor strips of the resonators are arranged is tilted relative to the wavefront propagation direction of the surface acoustic wave by the uniform angle $\zeta$. FIG. 11 schematically shows the configuration of such a filter 950. The filter 950 is a ladder-type filter having a series resonator 955 and a parallel resonator 956. The direction along which electrode fingers 953a of IDT electrodes 951a and conductor strips 954a of reflectors 952a of the series resonator 955 are arranged is tilted relative to the wavefront propagation direction of the surface acoustic wave by the power flow angle $\zeta$. In addition, the direction along which electrode fingers 953b of IDT electrodes 951b and conductor strips 954b of reflectors 952b of the parallel resonator 956 are arranged is also tilted relative to the wavefront propagation direction of the surface acoustic wave by the power flow angle $\zeta$.

The inventor have found that when a grating such as an IDT electrode or a reflector is disposed on a piezoelectric substrate, the power flow angle is different depending on the frequency of an excited surface acoustic wave. Here, in order to distinguish the power flow angle in the case of only a piezoelectric substrate from the actual power flow angle in the case where a grating is disposed on a piezoelectric substrate to form an acoustic wave device, the former is defined as "power flow angle of the piezoelectric substrate", and the latter is defined as "power flow angle of the grating". In addition, the angle formed between the direction perpendicular to the direction in which the electrode fingers of an IDT electrode extend and the direction along which the electrode fingers and the conductor strips of a reflector are arranged is referred to as tilt angle.

As described above, the power flow angle of the grating has frequency dependency, and thus an optimal tilt angle is different depending on the frequency of an excited surface acoustic wave. In other words, in a resonator used as a filter, a tilt angle at which energy is most effectively confined to reduce the loss is different between the resonant frequency and the anti-resonant frequency.

Therefore, in the case where the tilt angle is determined in accordance with the power flow angle of the grating at the resonant frequency, the loss can be reduced at the resonant frequency, but at the anti-resonant frequency, a loss occurs since a difference is produced between the power flow angle of the grating and the tilt angle. In general, when a filter is configured by using a plurality of resonators, the characteristic at the resonant frequency is important for one of the resonators, and the characteristic at the anti-resonant frequency is important for the other resonator. Thus, in the case where the tilt angles of all the resonators are determined in accordance with the power flow angle of the piezoelectric substrate as in the conventional art, either or both the characteristic of one of the resonators at the resonant frequency and the characteristic of the other resonator at the anti-resonant frequency deteriorate, resulting in deterioration of the characteristic of the entire filter.

Therefore, an object of the present invention is to reduce deterioration of a filter characteristic in the case where a surface acoustic wave filter is configured by using a piezoelectric substrate having beam steering in which the wavefront propagation direction of a surface acoustic wave is different from the direction of energy travel.

Solution to the Problems

A first aspect of the present invention is an acoustic wave device comprising first and second acoustic wave resonators, in which a first tilt angle that is an angle formed between a direction perpendicular to a direction in which electrode fingers of the first acoustic wave resonator extend and a direction along which the electrode fingers are arranged is made different from a second tilt angle that is an angle formed between a direction perpendicular to a direction in which electrode fingers of the second acoustic wave resonator extend and a direction along which the electrode fingers are arranged.

Here, preferably, the first acoustic wave resonator is a series resonator connected to a series arm, the second acoustic wave resonator is a parallel resonator connected to a parallel arm, a power flow angle at a resonant frequency of the first acoustic wave resonator is higher than a power flow angle at an anti-resonant frequency of the second acoustic wave resonator, and the first tilt angle is higher than the second tilt angle. Alternatively, the power flow angle at the resonant frequency of the first acoustic wave resonator may be lower than the power flow angle at the anti-resonant frequency of the second acoustic wave resonator, and the first tilt angle may be lower than the second tilt angle.

Alternatively, preferably, the first acoustic wave resonator is a series resonator connected to a series arm, and the first tilt angle is within a range of $\pm 1°$ from a power flow angle at a resonant frequency of the first acoustic wave resonator. Alternatively, the second acoustic wave resonator is a parallel resonator connected to a parallel arm, and the second tilt angle is within a range of $\pm 1°$ from a power flow angle at an anti-resonant frequency of the second acoustic wave resonator.

Alternatively, preferably, the first and second acoustic wave resonators are series resonators connected to a series arm, a power flow angle at a resonant frequency of the first acoustic wave resonator is higher than a power flow angle at a resonant frequency of the second acoustic wave resonator, and the first tilt angle is higher than the second tilt angle.

Alternatively, preferably, the first and second acoustic wave resonators are series resonators connected to a series arm, an anti-resonant frequency of the first acoustic wave resonator is lower than an anti-resonant frequency of the second acoustic wave resonator, and the absolute value of a difference between the first tilt angle and a power flow angle of a grating at the anti-resonant frequency of the first acoustic wave resonator is smaller than the absolute value of a difference between the second tilt angle and a power flow angle of a grating at the anti-resonant frequency of the second acoustic wave resonator.

Alternatively, preferably, the first and second acoustic wave resonators are parallel resonators connected to a parallel arm, a power flow angle at an anti-resonant frequency of the first acoustic wave resonator is lower than a power flow angle at an anti-resonant frequency of the second acoustic wave resonator, and the first tilt angle is lower than the second tilt angle.

Alternatively, preferably, the first and second acoustic wave resonators are parallel resonators connected to a parallel arm, a resonant frequency of the first acoustic wave resonator is higher than a resonant frequency of the second acoustic wave resonator, and the absolute value of a difference between the first tilt angle and a power flow angle of a grating at the resonant frequency of the first acoustic wave resonator is smaller than the absolute value of a difference between the second tilt angle and a power flow angle of a grating at the resonant frequency of the second acoustic wave resonator.

A second aspect of the present invention is an antenna duplexer comprising a first acoustic wave filter having a first frequency band as a pass band and a second acoustic wave filter having, as a pass band, a second frequency band higher than the first frequency band. The first acoustic wave filter includes a first acoustic wave resonator connected to a series arm and a second acoustic wave resonator connected to a parallel arm. The absolute value of a difference between a power flow angle at an anti-resonant frequency of the first acoustic wave resonator and a first tilt angle that is an angle formed between a direction perpendicular to a direction in which electrode fingers of the first acoustic wave resonator extend and a direction along which the electrode fingers are arranged is smaller than the absolute value of a difference between a power flow angle at a resonant frequency of the second acoustic wave resonator and a second tilt angle that is an angle formed between a direction perpendicular to a direction in which electrode fingers of the second acoustic wave resonator extend and a direction along which the electrode fingers are arranged.

A third aspect of the present invention is an antenna duplexer comprising a first acoustic wave filter having a first frequency band as a pass band and a second acoustic wave filter having, as a pass band, a second frequency band higher than the first frequency band. The second acoustic wave filter includes a first acoustic wave resonator connected to a series arm and a second acoustic wave resonator connected to a parallel arm. The absolute value of a difference between a power flow angle at a resonant frequency of the second acoustic wave resonator and a first tilt angle that is an angle formed between a direction perpendicular to a direction in which electrode fingers of the second acoustic wave resonator extend and a direction along which the electrode fingers are arranged is smaller than the absolute value of a difference between a power flow angle at an anti-resonant frequency of the first acoustic wave resonator and a second tilt angle that is an angle formed between a direction perpendicular to a direction in which electrode fingers of the first acoustic wave resonator extend and a direction along which the electrode fingers are arranged.

A fourth aspect of the present invention is an antenna duplexer comprising a first acoustic wave filter having a first frequency band as a pass band and a second acoustic wave filter having, as a pass band, a second frequency band higher than the first frequency band. The first acoustic wave filter is a reception filter which receives a signal, and includes a plurality of first acoustic wave resonators connected to a series arm and a second acoustic wave resonator connected to a parallel arm. The absolute value of a difference between a power flow angle at a resonant frequency of a series resonator at an input-side first stage among the first series resonators and a first tilt angle that is an angle formed between a direction perpendicular to a direction in which electrode fingers of the series resonator at the input-side first stage extend and a direction along which the electrode fingers are arranged is smaller than the absolute value of a difference between a power flow angle at a resonant frequency of any one series resonator at a stage other than the input-side first stage among the first series resonators and a second tilt angle that is an angle formed between a direction perpendicular to a direction in which electrode fingers of said any one series resonator at the stage other than the input-side first stage extend and a direction along which the electrode fingers are arranged.

A fifth aspect of the present invention is an antenna duplexer comprising a first acoustic wave filter having a first frequency band as a pass band and a second acoustic wave filter having, as a pass band, a second frequency band higher than the first frequency band. The second acoustic wave filter is a reception filter which receives a signal, and includes a plurality of first acoustic wave resonators connected to a series arm and a second acoustic wave resonator connected to a parallel arm. The absolute value of a difference between a power flow angle at a resonant frequency of a series resonator at an input-side first stage among the first series resonators and a first tilt angle that is an angle formed between a direction perpendicular to a direction in which electrode fingers of the series resonator at the input-side first stage extend and a direction along which the electrode fingers are arranged is smaller than the absolute value of a difference between a power flow angle at a resonant frequency of any one series resonator at a stage other than the input-side first stage among the first series resonators and a second tilt angle that is an angle formed between a direction perpendicular to a direction in which electrode fingers of said any one series resonator at the stage other than the input-side first stage extend and a direction along which the electrode fingers are arranged.

Advantageous Effects of the Invention

According to the present invention, in the case where a surface acoustic wave filter is configured by using a piezoelectric substrate having beam steering in which the wavefront propagation direction of a surface acoustic wave is different from the direction of energy travel, deterioration of a filter characteristic can be reduced.

DESCRIPTION OF EMBODIMENTS

Best Mode for Carrying out the Invention (First Embodiment)

Figure 1:
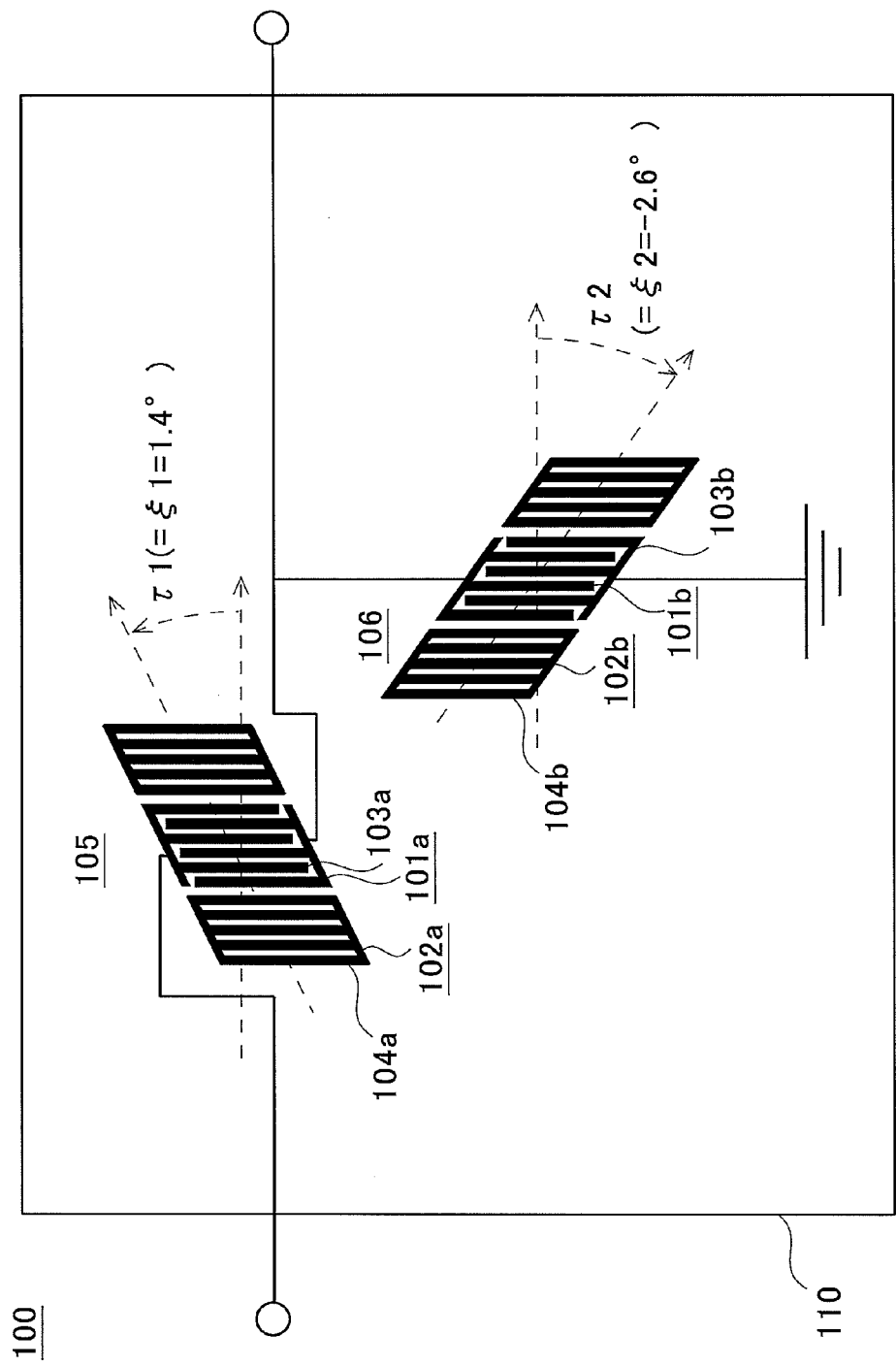
FIG. 1 is a configuration diagram of a filter according to a first embodiment of the present invention.

FIG. 1 is a configuration diagram of a ladder-type filter 100 according to the present embodiment. The ladder-type filter 100 is composed of a serially-connected series resonator 105 and a parallel-connected parallel resonator 106. Electrode fingers 103a and 103b of respective IDT electrodes 101a and 101b and conductor strips 104a and 104b of the respective reflectors 102a and 102b of these resonators are arranged so as to be parallel to each other such that the direction in which they extend is orthogonal to an X axis that is a direction in which the wavefront of a surface acoustic wave propagates. In addition, the directions along which they are arranged are different between the series resonator 105 and the parallel resonator 106, and lie along the directions of tilt angles $\tau 1$ and $\tau 2$, respectively. The ladder-type filter 100 is different from the conventional ladder-type filter 950 in that the tilt angle is different for each resonator.

As a piezoelectric substrate 110 of the ladder-type filter 100, for example, a lithium niobate ($LiNbO_3$) type piezoelectric substance is used, and Euler angles ($\phi$, $\theta$, $\psi$) are (15°, 85°, −15°). In addition, for the IDT electrodes 101a and 101b and the reflectors 102a and 102b, for example, a single metal such as aluminum, copper, silver, gold, titanium, tungsten, molybdenum, platinum, or chromium, an alloy containing these metals as a principal component, or an electrode composed of a laminate in which these metals are laminated is used.

In general, in such a piezoelectric substrate having a cut angle of triple rotation, there is no symmetry of crystal about the wavefront propagation direction of the surface acoustic wave, and thus beam steering occurs in which a direction of phase propagation is different from the direction of energy travel. Furthermore, in the case where a grating is disposed on such a piezoelectric substrate, a power flow angle of the grating having frequency dependency is provided. In the present embodiment, the power flow angle is 1.4° at the resonant frequency and −2.6° at the anti-resonant frequency.

Thus, the tilt angles of the series resonator 105 and the parallel resonator 106 are made different from each other, thereby reducing deterioration of the filter characteristic. For example, as shown in FIG. 1, in the series resonator 105, the tilt angle $\tau 1$ is set to 1.4° which is the power flow angle $\zeta 1$ of the grating at the resonant frequency, and in the parallel resonator 106, the tilt angle $\tau 2$ is set to −2.6° which is the power flow angle $\zeta 2$ of the grating at the anti-resonant frequency. It should be noted that the tilt angles $\tau 1$ and $\tau 2$ are exaggeratingly shown in FIG. 1. The same applies to other drawings. Due to this configuration, losses at the resonant frequency of the series resonator 105 and the anti-resonant frequency of the parallel resonator 106 can be reduced, and deterioration of the filter characteristic of the ladder-type filter 100 can be suppressed.

Figure 2:
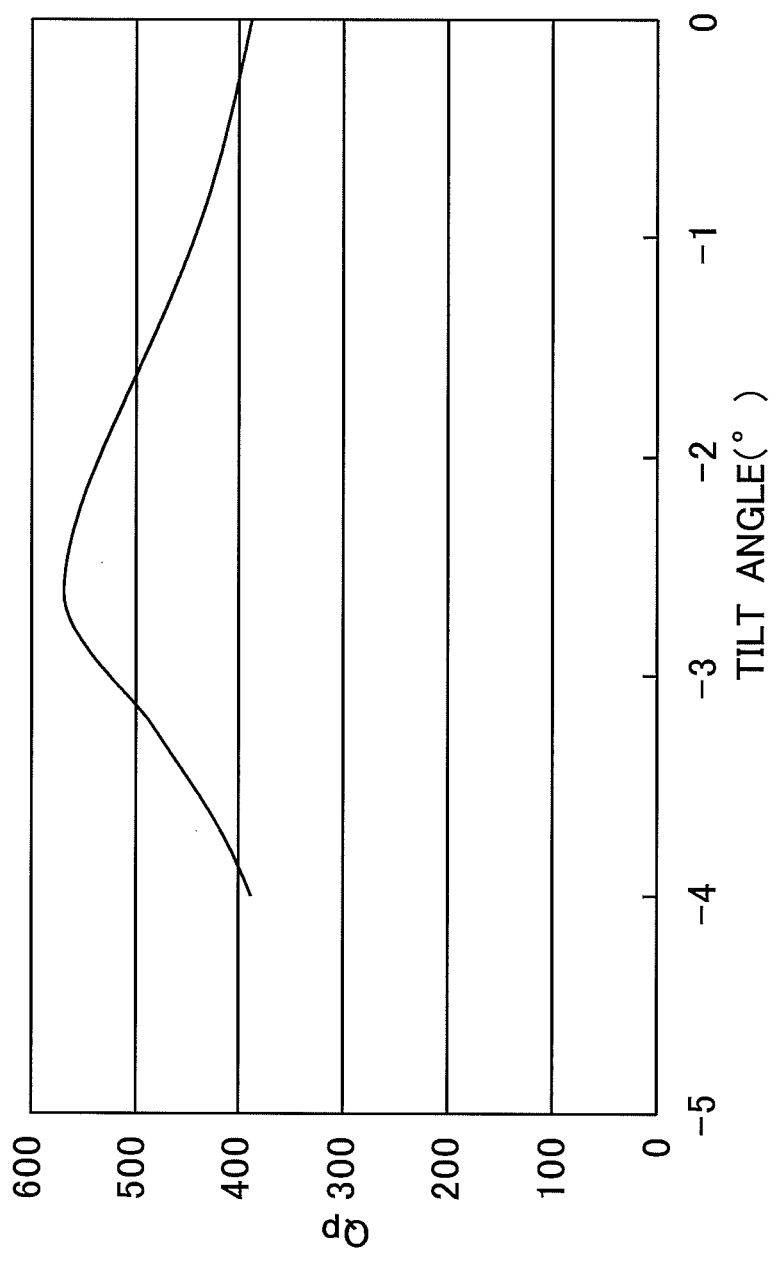
FIG. 2 is a diagram showing the relationship between a tilt angle and a Q-value at an anti-resonant frequency according to the first embodiment of the present invention.

It should be noted that the tilt angle is made to coincide with the power flow angle of the grating in the above, but may not be made to exactly coincide with the power flow angle of the grating. FIG. 2 shows an example of the relationship between the tilt angle and a Qp-value that is a Q-value at the anti-resonant frequency. As shown in FIG. 2, even when the tilt angle is within a range of ±1° from a grating power flow angle of −2.6°, deterioration from the maximum of the Q-value can be suppressed within 20%. In addition, even if the tilt angle is not within such an angle range, when the tilt angle is set within a given range from the power flow angle, the Q-value can be improved. Furthermore, the case has been described where the resonator in which the tilt angle is made to coincide with the power flow angle of the grating is applied to the ladder-type filter. However, even when such a resonator is applied to another type of filter, the same advantageous effects are obtained.

In addition, when forming each resonator on the piezoelectric substrate, each resonator may be formed such that the direction in which the electrode fingers of each resonator extend is the same as or different from that of the other resonator.

(Second Embodiment)

Figure 3:
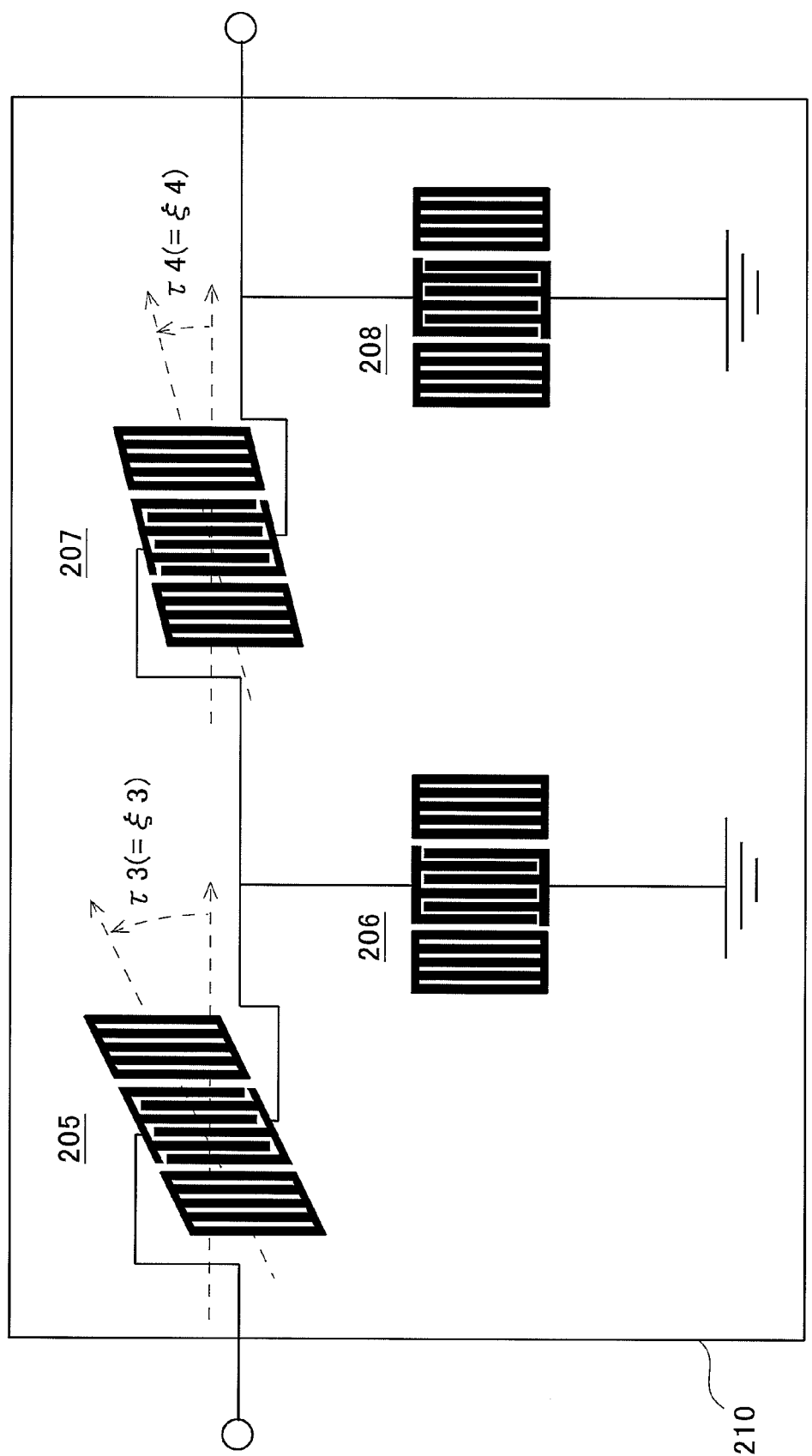
FIG. 3 is a configuration diagram of a filter according to a second embodiment of the present invention.

Hereinafter, a second embodiment of the present invention will be described with reference to the drawings. It should be noted that the configuration that is not particularly described is the same as in the first embodiment. FIG. 3 is a configuration diagram of a ladder-type filter 200 according to the present embodiment. As shown in FIG. 3, the ladder-type filter 200 is a two-stage ladder-type filter configured by disposing a series resonator 205 and a parallel resonator 206 on a piezoelectric substrate 210, and further sequentially disposing a series resonator 207 and a parallel resonator 208 at the subsequent stage thereon. In general, in a two-stage ladder-type filter, the resonant frequency of a series resonator at the first stage is different from the resonant frequency of a series resonator at the second stage.

In the ladder-type filter 200 as well, the resonant frequencies of the series resonators 205 and 207 are different from each other, and a power flow angle $\zeta 3$ of the grating at the resonant frequency of the series resonator 205 and a power flow angle $\zeta 4$ of the grating at the resonant frequency of the series resonator 207 are also different from each other. Thus, in the ladder-type filter 200, the tilt angles $\tau 3$ and $\tau 4$ of the series resonator 205 and the series resonator 207 are made different from each other. Specifically, as shown in FIG. 3, the tilt angle $\tau 3$ of the series resonator 205 is set within a range of $\pm 1°$ from the value of the power flow angle $\zeta 3$ of the grating at the resonant frequency of the series resonator 205, and the tilt angle $\tau 4$ of the series resonator 207 is set within a range of $\pm 1°$ from the value of the power flow angle $\zeta 4$ of the grating at the resonant frequency of the series resonator 207.

In the ladder-type filter 200, the resonant frequency of the series resonator 205 is higher than the resonant frequency of the series resonator 207, the tilt angle $\tau 3$ of the series resonator 205 is higher than the tilt angle $\tau 4$ of the series resonator 207. Thus, a loss caused by beam steering at the resonant frequency of each of the series resonators 205 and 207 can be suppressed, and hence deterioration of the filter characteristic can be suppressed. It should be noted that the case has been described as an example where the number of the stages of the ladder is two, but even in the case of three or more stages, the same advantageous effects are obtained when the tilt angle of each series resonator is set within the range of $\pm 1°$ from the value of the power flow angle of the grating at its resonant frequency.

Figure 4:
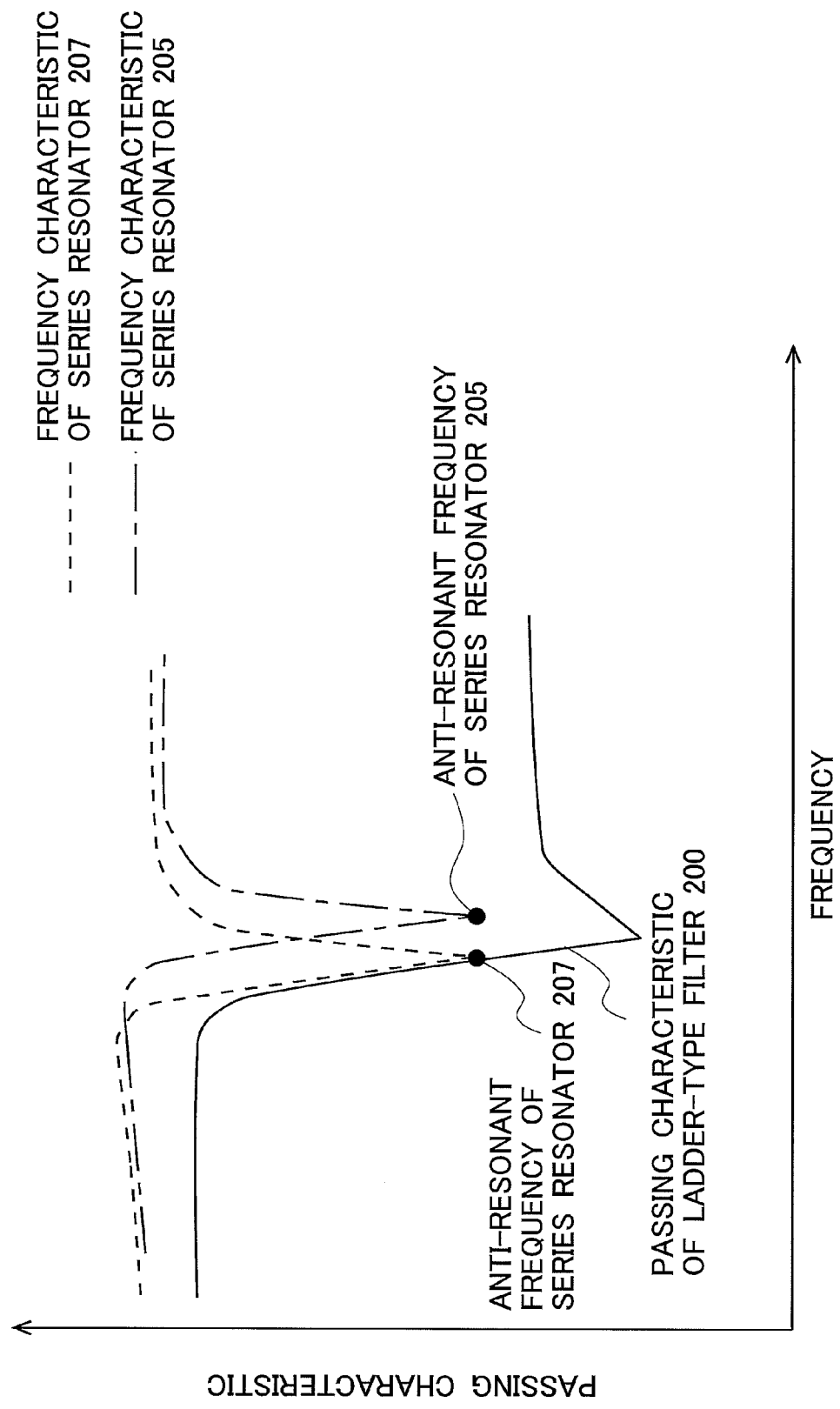
FIG. 4 is a diagram showing the frequency characteristics of the filter and resonators according to the second embodiment of the present invention.

FIG. 4 is a diagram showing the frequency characteristic of the series resonator 205, the frequency characteristic of the series resonator 207, and the passing characteristic of the ladder-type filter 200. As shown in FIG. 4, a line indicating the frequency characteristic of the series resonator 207 is present on the inner side of the pass band of the ladder-type filter 200 with respect to a line indicating the frequency characteristic of the series resonator 205, and the anti-resonant frequency of the series resonator 207 is lower than the anti-resonant frequency of the series resonator 205. Thus, the frequency characteristic of the series resonator 207 more greatly influences steepness on the high-frequency side of the pass band of the ladder-type filter 200 than the frequency characteristic of the series resonator 205. Therefore, in order to suppress a deterioration amount of the Q-value at the anti-resonant frequency of the series resonator 207 so as to be smaller than a deterioration amount of the Q-value at the anti-resonant frequency of the series resonator 205, the absolute value of the difference between the tilt angle and the power flow angle of the grating at the anti-resonant frequency of the series resonator 207 is desirably made smaller than the absolute value of the difference between the tilt angle and the power flow angle of the grating at the anti-resonant frequency of the series resonator 205. By so doing, the steepness on the high-frequency side of the pass band of the ladder-type filter 200 is improved.

In other words, for example, when the tilt angle of the series resonator having the lowest anti-resonant frequency among a plurality of series resonators is set within the range of $\pm 1°$ from the value of the power flow angle of the grating at the anti-resonant frequency of this series resonator and the tilt angles of the other series resonators are set within the ranges of $\pm 1°$ from the values of the power flow angles of the gratings at their resonant frequencies, both suppression of deterioration of the filter characteristic of the ladder-type filter 200 and the steepness on the high-frequency side can be achieved.

(Third Embodiment)

Figure 5:
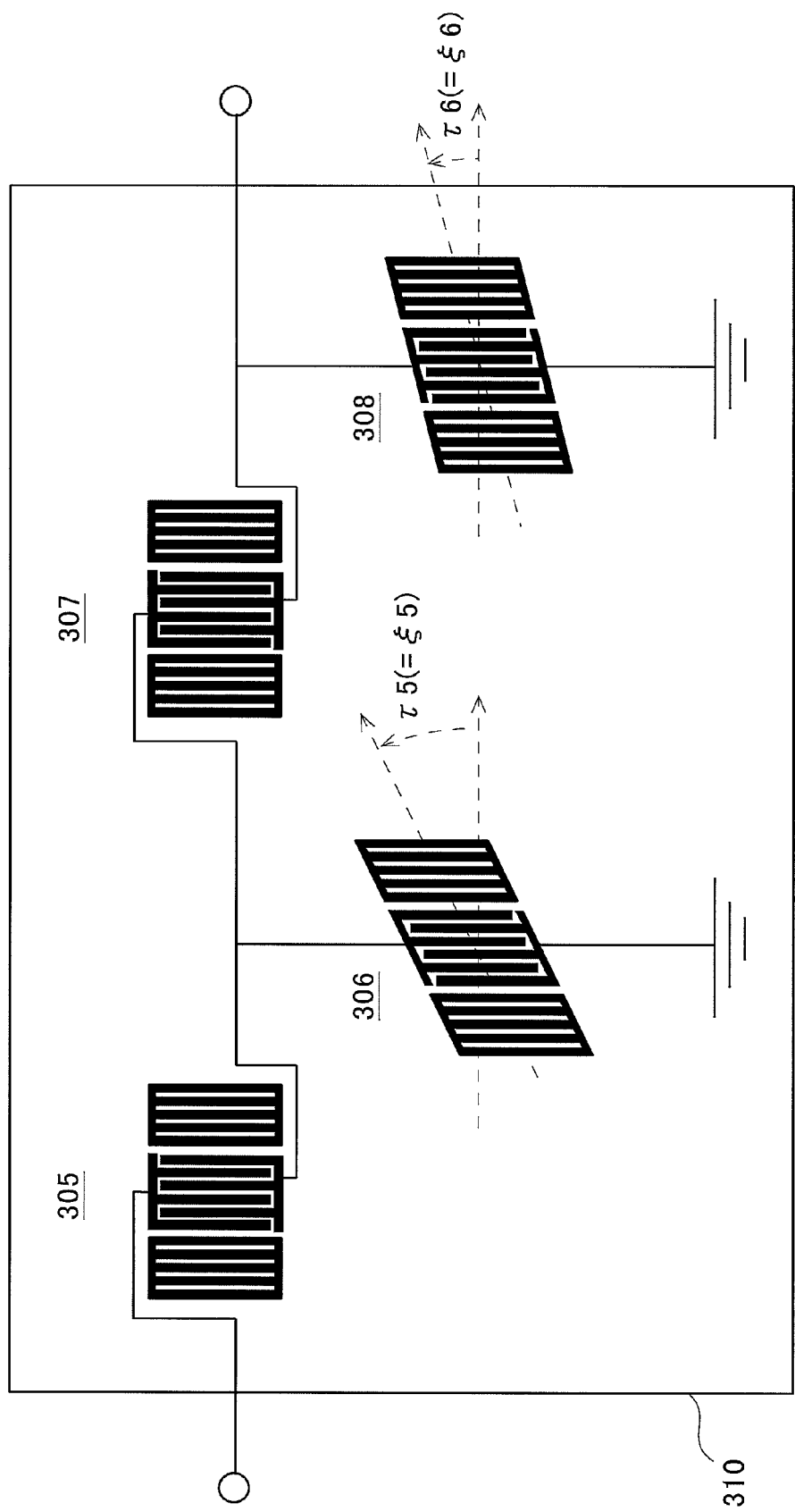
FIG. 5 is a configuration diagram of a filter according to a third embodiment of the present invention.

Hereinafter, a third embodiment of the present invention will be described with reference to the drawings. It should be noted that the configuration that is not particularly described is the same as in the first embodiment. FIG. 5 is a configuration diagram of a ladder-type filter 300 according to the present embodiment. As shown in FIG. 5, the ladder-type filter 300 is a two-stage ladder-type filter configured by disposing a series resonator 305 and a parallel resonator 306 on a piezoelectric substrate 310, and further sequentially disposing a series resonator 307 and a parallel resonator 308 at the subsequent stage thereon.

The ladder-type filter 300 is a filter in which the tilt angle of each series resonator is set to 0° and the tilt angles of the parallel resonators are made different from each other in the ladder-type filter 200 according to the second embodiment. In general, in a two-stage ladder-type filter, the anti-resonant frequency of the parallel resonator at the first stage and the anti-resonant frequency of the parallel resonator at the second stage are different from each other. In the ladder-type filter 300 as well, the anti-resonant frequencies of the parallel resonators 306 and 308 are different from each other, and a power flow angle $\zeta 5$ of the grating at the anti-resonant frequency of the parallel resonator 306 and a power flow angle $\zeta 6$ of the grating at the anti-resonant frequency of the parallel resonator 308 are also different from each other. Thus, as shown in FIG. 5, the tilt angles $\tau 5$ and $\tau 6$ of the parallel resonator 306 and the parallel resonator 308 are made different from each other. Specifically, the tilt angle $\tau 5$ of the parallel resonator 306 is set within a range of $\pm 1°$ from the value of the power flow angle $\zeta 5$ of the grating at the anti-resonant frequency of the parallel resonator 306, and the tilt angle $\tau 6$ of the parallel resonator 308 is set within a range of $\pm 1°$ from the value of the power flow angle $\tau 6$ of the grating at the anti-resonant frequency of the parallel resonator 308.

In the ladder-type filter 300, the anti-resonant frequency of the parallel resonator 306 is higher than the anti-resonant frequency of the parallel resonator 308, and the tilt angle $\tau 5$ of the parallel resonator 306 is higher than the tilt angle $\tau 6$ of the parallel resonator 308. Thus, a loss caused by beam steering at the anti-resonant frequency of each of the parallel resonators 306 and 308 can be suppressed, and hence deterioration of the filter characteristic can be suppressed. It should be noted that the case has been described as an example where the number of the stages of the ladder is two, but even in the case of three or more stages, the same advantageous effects are obtained when the tilt angle of each parallel resonator is set within the range of ±1° from the value of the power flow angle of the grating at its anti-resonant frequency.

It should be noted that in the ladder-type filter 300, in addition to the parallel resonators 306 and 308, the tilt angle of each of the series resonators 305 and 307 may be set within a range of ±1° from the value of the power flow angle of the grating at its resonant frequency.

Figure 6:
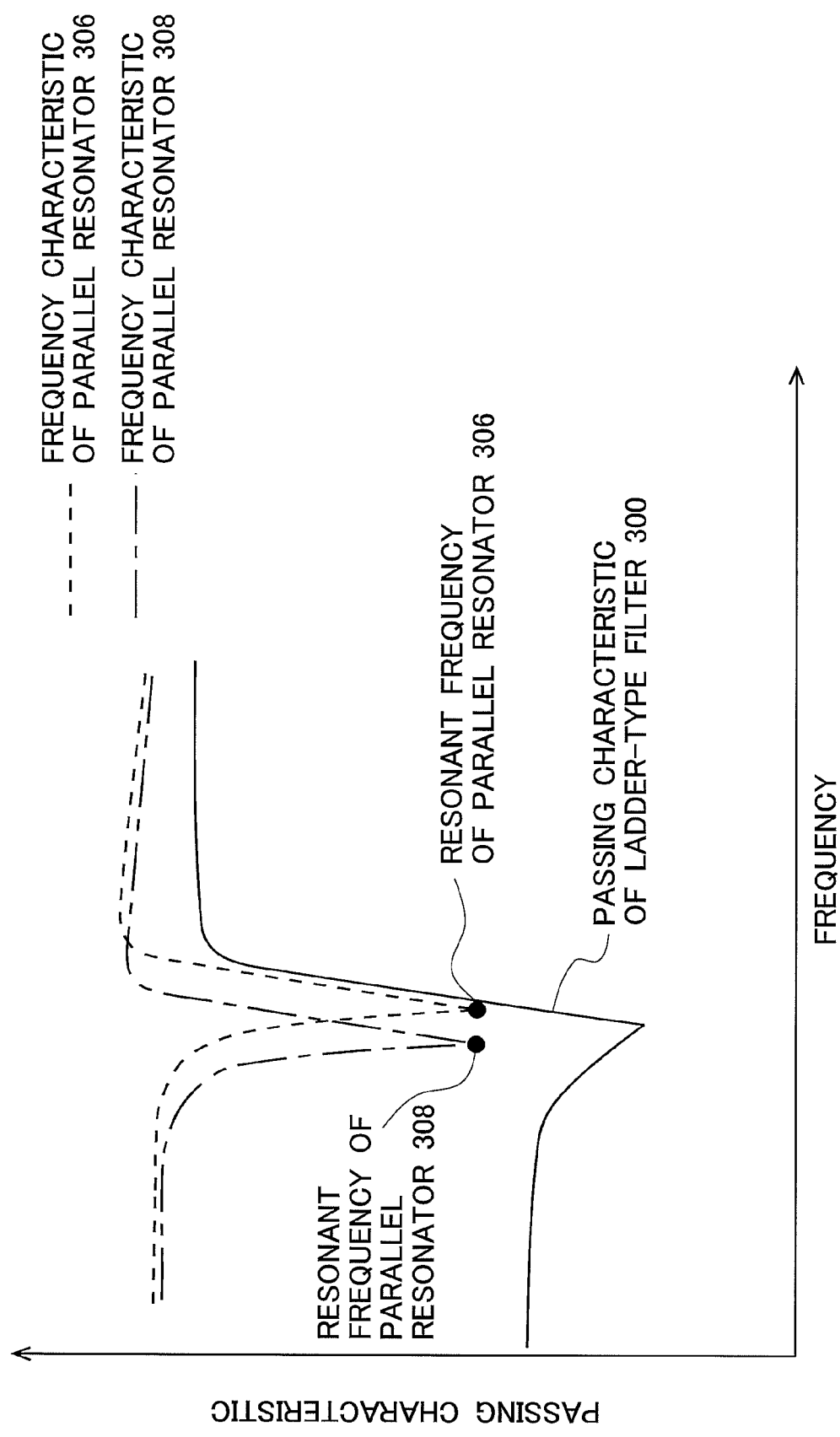
FIG. 6 is a diagram showing the frequency characteristics of the filter and resonators according to the third embodiment of the present invention.

FIG. 6 is a diagram showing the frequency characteristic of the parallel resonator 306, the frequency characteristic of the parallel resonator 308, and the passing characteristic of the ladder-type filter 300. As shown in FIG. 6, a line indicating the frequency characteristic of the parallel resonator 306 is present on the inner side of the pass band of the ladder-type filter 300 with respect to a line indicating the frequency characteristic of the parallel resonator 308, and the resonant frequency of the parallel resonator 306 is higher than the resonant frequency of the parallel resonator 308. Thus, the frequency characteristic of the parallel resonator 306 more greatly influences steepness on the low-frequency side of the pass band of the ladder-type filter 300 than the frequency characteristic of the parallel resonator 308. Therefore, in order to suppress a deterioration amount of the Q-value at the resonant frequency of the parallel resonator 306 so as to be smaller than a deterioration amount of the Q-value at the resonant frequency of the parallel resonator 305, the absolute value of the difference between the tilt angle and the power flow angle of the grating at the resonant frequency of the parallel resonator 306 is desirably made smaller than the absolute value of the difference between the tilt angle and the power flow angle of the grating at the resonant frequency of the parallel resonator 308. By so doing, the steepness on the low-frequency side of the pass band of the ladder-type filter 300 is improved.

(Fourth Embodiment)

Figure 7:
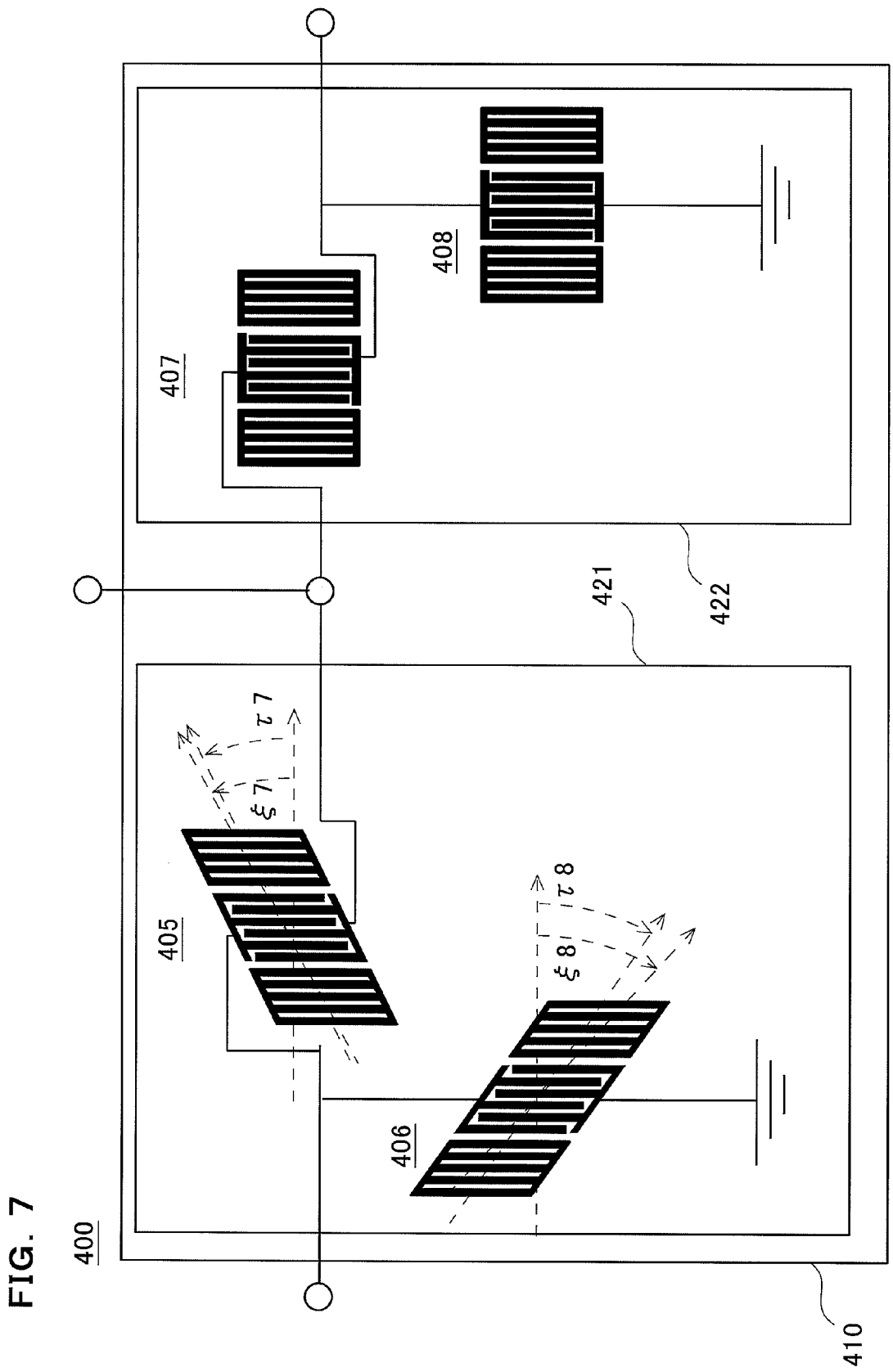
FIG. 7 is a configuration diagram of a filter according to a fourth embodiment of the present invention.

Hereinafter, a fourth embodiment of the present invention will be described with reference to the drawing. It should be noted that the configuration that is not particularly described is the same as in the first embodiment. FIG. 7 is a configuration diagram of a duplexer 400 according to the present embodiment. As shown in FIG. 7, the duplexer 400 is configured by forming and connecting a ladder-type filter 421 having a first frequency band as a pass band and a ladder-type filter 422 having a second frequency band as a pass band on a piezoelectric substrate 410. Hereinafter, the first frequency band is on the low-frequency side of the second frequency band. Regarding a use for these frequency bands, for example, the first frequency band is set as a transmission band, and the second frequency band is set as a reception band.

In general, in a duplexer, the passing characteristic of a filter as well as the isolation characteristic are important. In other words, the attenuation characteristic on the high-frequency side of the first frequency band and the attenuation characteristic on the low-frequency side of the second frequency band are important. Here, in the ladder-type filter, an attenuation pole of the filter characteristic on the low-frequency side is composed of the anti-resonant frequency of a parallel-connected resonator, and an attenuation pole of the filter characteristic on the high-frequency side is composed of the anti-resonant frequency of a serially-connected resonator. Therefore, the Q-value at the anti-resonant frequency of the serially-connected resonator which constitutes the attenuation pole on the high-frequency side is important for the ladder-type filter 421 having the first frequency band as a pass band.

In the duplexer 400, the tilt angles $\tau7$ and $\tau8$ of a series resonator 405 and a parallel resonator 406 of the ladder-type filter 421 are made different from each other, and the absolute value of the difference between the tilt angle $\tau7$ and a power flow angle $\zeta7$ of the grating at the anti-resonant frequency of the series resonator 405 is made smaller than the absolute value of the difference between the tilt angle $\tau8$ and a power flow angle $\zeta8$ of the grating at the resonant frequency of the parallel resonator. By so doing, a loss at the anti-resonant frequency of the series resonator 405 is preferentially reduced to improve the Q-value, and the attenuation characteristic of the ladder-type filter 401 is improved. As described above, in the filter having a pass band on the low-frequency side, the attenuation characteristic on the high-frequency side regarding the isolation characteristic is improved, whereby the isolation characteristic of the duplexer 400 can be improved.

It should be noted that in the case where the anti-resonant frequencies of a plurality of series resonators are different from each other in the ladder-type filter 421 having the first frequency band as a pass band, a line indicating the frequency characteristic of a series resonator having a relatively low anti-resonant frequency is present on the inner side of the pass band of the ladder-type filter 421 with respect to a line indicating the frequency characteristic of a series resonator having a relatively high anti-resonant frequency, and the frequency characteristic of the series resonator having the relatively low anti-resonant frequency more greatly influences steepness on the high-frequency side of the pass band of the ladder-type filter 421 than the frequency characteristic of the series resonator having the relatively high anti-resonant frequency. Thus, the absolute value of the difference between the tilt angle and the power flow angle of the grating at the anti-resonant frequency of the series resonator having the relatively low anti-resonant frequency is desirably made smaller than the absolute value of the difference between the tilt angle and the power flow angle of the grating at the anti-resonant frequency of the series resonator having the relatively high anti-resonant frequency. By so doing, the steepness on the high-frequency side of the pass band of the ladder-type filter 421 is improved.

(Fifth Embodiment)

Hereinafter, a fifth embodiment of the present invention will be described with reference to the drawing. It should be noted that the configuration that is not particularly described is the same as in the first embodiment. As described above, in a duplexer, not only the attenuation characteristic on the high-frequency side of the first frequency band but also the attenuation characteristic on the low-frequency side of the second frequency band are important. Therefore, for a filter having the second frequency band as a pass band, the Q-value at the resonant frequency of a parallel-connected resonator that constitutes an attenuation pole on the low-frequency side is important.

Figure 8:
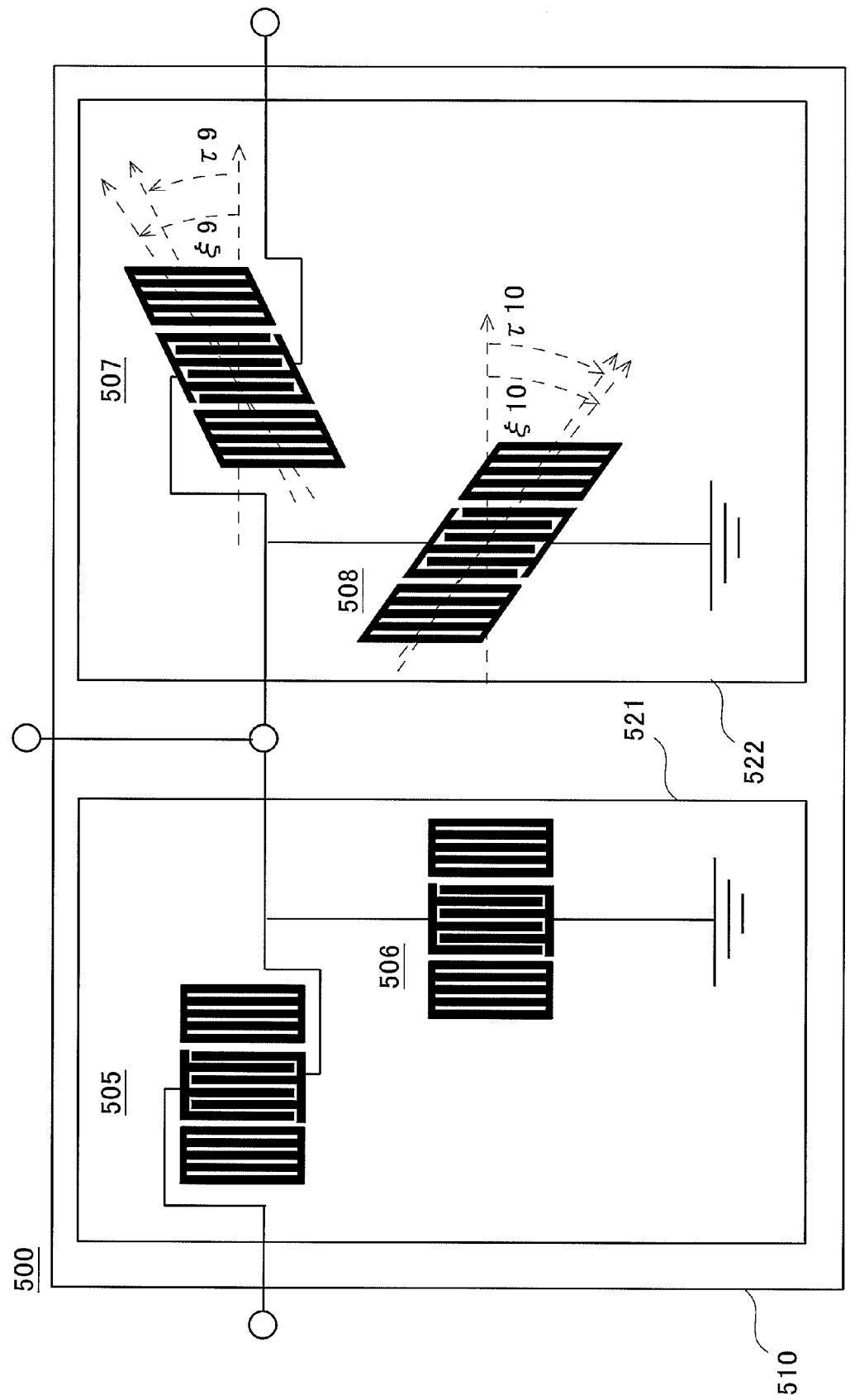
FIG. 8 is a configuration diagram of a filter according to a fifth embodiment of the present invention.

FIG. 8 is a configuration diagram of a duplexer 500 according to the present embodiment. The duplexer 500 is a duplexer in which the tilt angle of each resonator of the ladder-type filter having the first frequency band as a pass band is set to 0° and the tilt angles of the respective resonators of the ladder-type filter having the second frequency band as a pass band are made different from each other in the duplexer 400 of the fourth embodiment.

In other words, as shown in FIG. 8, the tilt angles of a series resonator 505 and a parallel resonator 506 of a ladder-type filter 521 that is formed on a piezoelectric substrate 510 and has a first frequency band as a pass band are set to 0°, the tilt angles of a series resonator 507 and a parallel resonator 508 of a ladder-type filter 522 having a second frequency band as a pass band are made different from each other to be τ9 and τ10, and the absolute value of the difference the tilt angle τ10 and a power flow angle ζ10 of the grating at the resonant frequency of the parallel resonator 508 is made smaller than the absolute value of the difference between the tilt angle τ9 and a power flow angle ζ9 of the grating at the anti-resonant frequency of the series resonator 507. By so doing, a loss at the resonant frequency of the parallel resonator 508 is preferentially reduced to improve the Q-value, and the attenuation characteristic of the ladder-type filter 522 on the low-frequency side is improved. As described above, in the filter having a pass band on the high-frequency side, the attenuation characteristic on the low-frequency side regarding the isolation characteristic is improved, whereby the isolation characteristic of the duplexer 500 can be improved.

It should be noted that a duplexer may be configured which employs the ladder-type filter 421 of the fourth embodiment as a filter having the first frequency band as a pass band and the ladder-type filter 522 of the fifth embodiment as a filter having the second frequency band as a pass band. In this case, the isolation characteristic of the duplexer can be improved further.

In addition, improvement of the attenuation characteristic, on the low-frequency side, of the filter having the first frequency band as a pass band and of the attenuation characteristic, on the high-frequency side, of the filter having the second frequency band as a pass band does not contribute to improvement of the isolation characteristic of the duplexer, but is made as appropriate in accordance with a band characteristic required for each filter. For example, in the ladder-type filter 421 of the fourth embodiment having the first frequency band as a pass band, the absolute value of the difference between the tilt angle τ8 and the power flow angle ζ8 of the grating at the resonant frequency of the parallel resonator 406 may be reduced so as to be nearly equal to the absolute value of the difference between the tilt angle τ7 and the power flow angle ζ7 of the grating at the anti-resonant frequency of the series resonator 405. In this case, the attenuation characteristic of the ladder-type filter 422 on the low-frequency side is improved. In addition, in the ladder-type filter 522 of the fifth embodiment having the second frequency band as a pass band, the absolute value of the difference between the tilt angle τ9 and the power flow angle ζ9 of the grating at the anti-resonant frequency of the series resonator 507 may be reduced so as to be nearly equal to the absolute value of the difference between the tilt angle τ10 and the power flow angle ζ10 of the grating at the resonant frequency of the parallel resonator 508. In this case, the attenuation characteristic of the ladder-type filter 522 on the high-frequency side is improved.

It should be noted that in the case where the resonant frequencies of a plurality of parallel resonators are different from each other in the ladder-type filter 522 having the second frequency band as a pass band, a line indicating the frequency characteristic of a parallel resonator having a relatively high resonant frequency is present on the inner side of the pass band of the ladder-type filter 522 with respect to a line indicating the frequency characteristic of a parallel resonator having a relatively low resonant frequency, and the frequency characteristic of the parallel resonator having the relatively high resonant frequency more greatly influences steepness on the low-frequency side of the pass band of the ladder-type filter 522 than the frequency characteristic of the parallel resonator having the relatively low resonant frequency. Thus, the absolute value of the difference between the tilt angle and the power flow angle of the grating at the resonant frequency of the parallel resonator having the relatively high resonant frequency is desirably made smaller than the absolute value of the difference between the tilt angle and the power flow angle of the grating at the resonant frequency of the parallel resonator having the relatively low resonant frequency. By so doing, the steepness on the high-frequency side of the pass band of the ladder-type filter 522 is improved.

(Sixth Embodiment)

Figure 9:
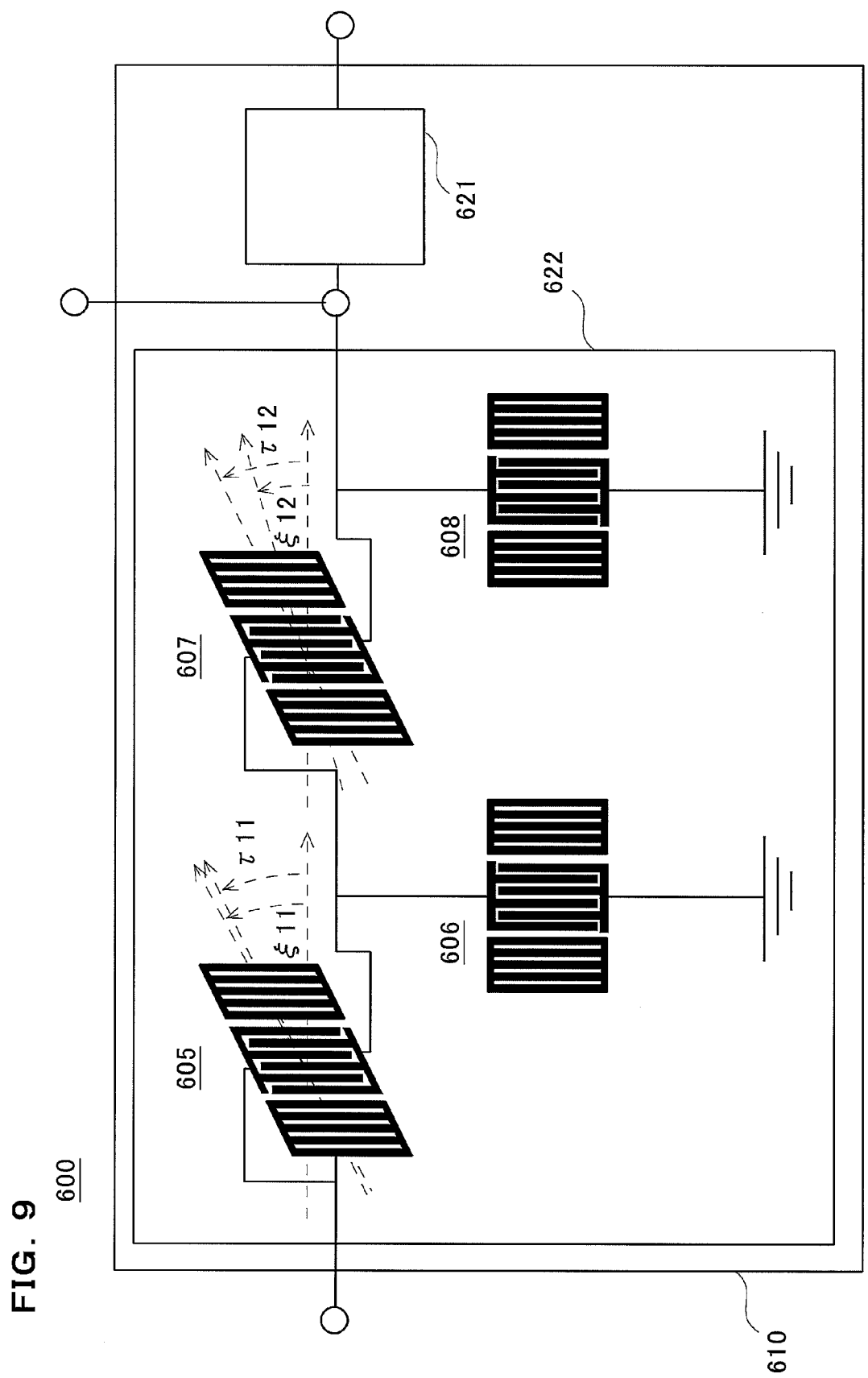
FIG. 9 is a configuration diagram of a filter according to a sixth embodiment of the present invention.
Figure 10:
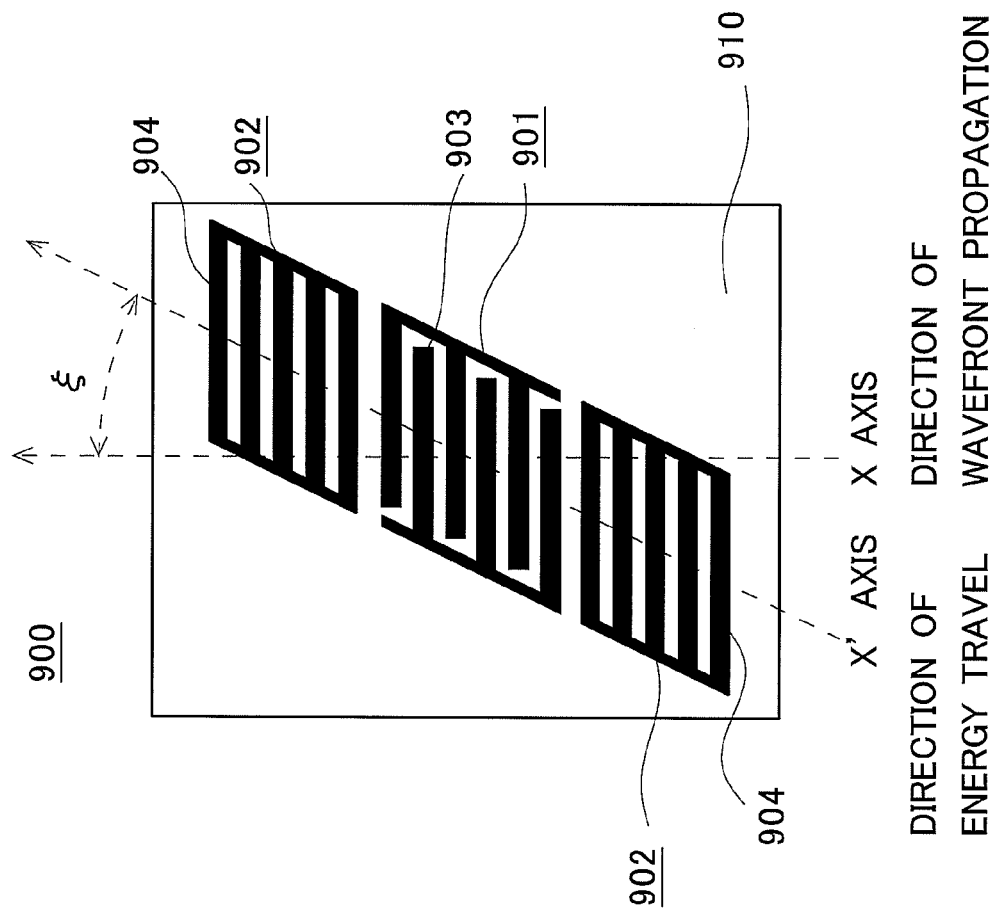
FIG. 10 is a configuration diagram of a conventional filter.
Figure 11:
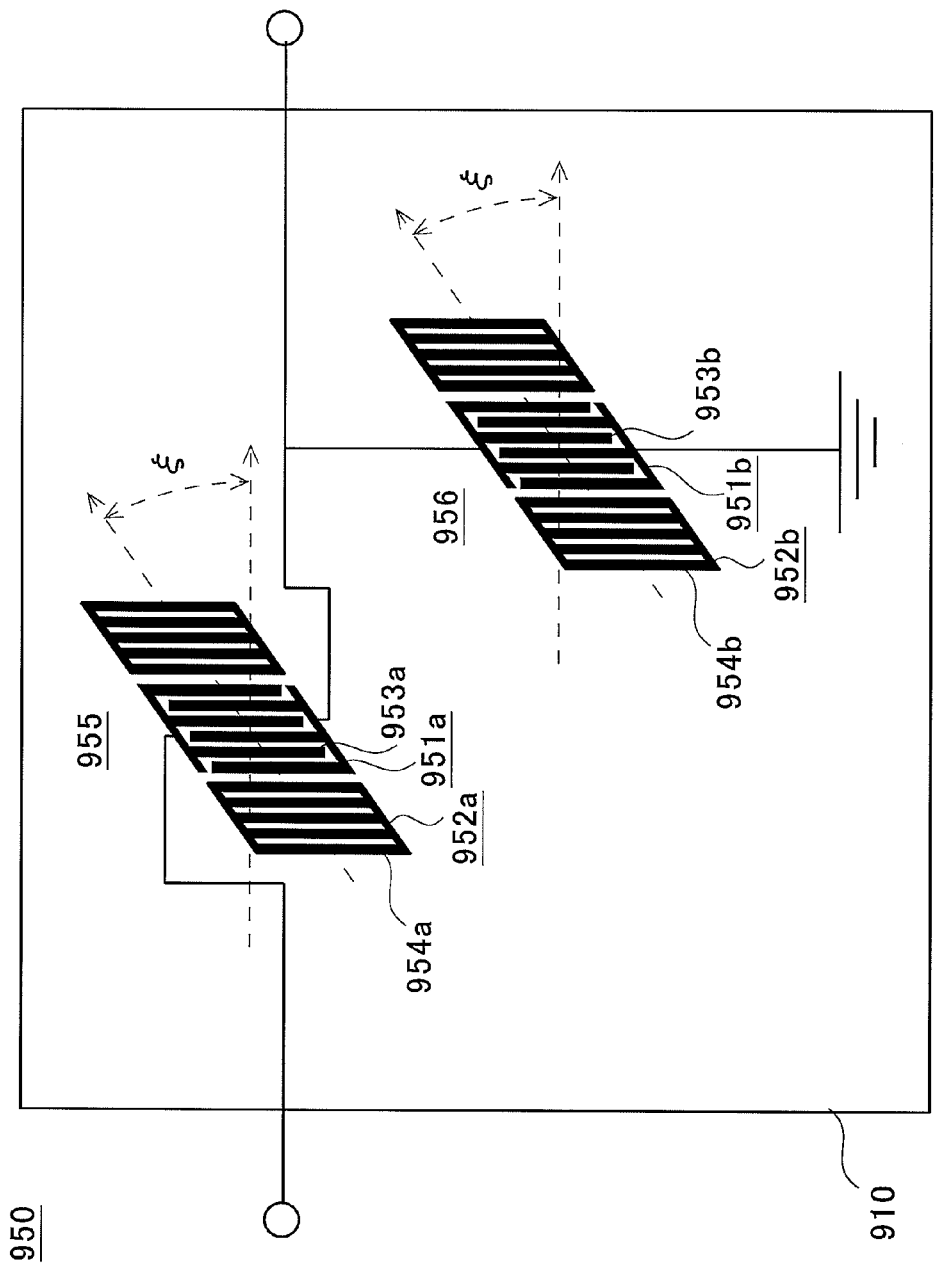
FIG. 11 is a configuration diagram of the conventional filter.

Hereinafter, a fifth embodiment of the present invention will be described with reference to the drawing. It should be noted that the configuration that is not particularly described is the same as in the first embodiment. FIG. 9 is a configuration diagram of a duplexer 600 according to the present embodiment. The duplexer 600 is configured by connecting a filter 621 having a first frequency band as a pass band and a two-stage ladder-type filter 622 having a second frequency band as a pass band. The filter 621 is a filter on the transmission side, and the ladder-type filter 622 is a filter on the reception side. The internal configuration of the filter 621 is not shown, but any one of the ladder-type filters in the respective embodiments described above or any filter may be used as the filter 621.

In general, in a multi-stage ladder-type filter used as a filter on the reception side, greatest power is applied to a series resonator at the first stage. Therefore, in order to ensure power durability, the series resonator at the first stage is particularly required to have a low loss.

Thus, the absolute value of the difference between a tilt angle τ11 and a power flow angle ζ11 of the grating at the resonant frequency of a series resonator 605 at the first stage of the ladder-type filter 622 of the duplexer 600 is made smaller than the absolute value of the difference between a tilt angle τ12 and a power flow angle ζ12 of the grating at the resonant frequency of a series resonator 607 at the second stage. By so doing, a loss of the series resonator at the first stage is preferentially reduced, and the power durability of the ladder-type filter 622 can be improved.

It should be noted that even in the case where the first pass band is set as a reception band and the second pass band is set as a transmission band, the same advantageous effects are obtained when the above ladder-type filter 622 is used as a filter having the first frequency band as a pass band.

In addition, the ladder-type filter 622 is not only used as a portion of a duplexer but also can be used as a stand-alone filter.

In addition, a ladder-type filter of three or more stages may be used instead of the two-stage ladder-type filter. In this case, the absolute value of the difference between a tilt angle and a power flow angle of the grating at the resonant frequency of a series resonator at the first stage suffices to be made smaller than the absolute value of the difference between a tilt angle and a power flow angle of the grating at the resonant frequency of any one series resonators at a stage other than the first stage.

INDUSTRIAL APPLICABILITY

The present invention is useful for an acoustic wave device used in an information communication apparatus or the like. In particular, the present invention is applicable to a duplexer used in an electronic apparatus such as a mobile phone.

DESCRIPTION OF THE REFERENCE CHARACTERS 100, 200, 300, 421, 422, 521, 522, 621, 622, 900, 950 filter
101a, 101b, 901, 951a, 951b IDT electrode 102a, 102b, 902, 952a, 952b reflector
103a, 103b, 903, 953a, 953b electrode finger
104a, 104b, 904, 954a, 954b conductor strip
105, 205, 207, 305, 307, 405, 407, 505, 507, 605, 607, 955 series resonator
106, 206, 208, 306, 308, 406, 408, 506, 508, 956 parallel resonator
110, 210, 310, 410, 510, 910 piezoelectric substrate
400, 500, 600 duplexer

The invention claimed is:

1. An acoustic wave device comprising:
a first acoustic wave resonator, the first acoustic wave resonator being a series resonator connected to a series arm of the acoustic wave device and including a first plurality of electrode fingers, the first acoustic wave resonator having a first tilt angle that is an angle formed between a direction perpendicular to a direction in which the first plurality of electrode fingers of the first acoustic wave resonator extend and a direction along which the first plurality of electrode fingers are arranged, the first tilt angle being within a range of ±1° from a power flow angle at a resonant frequency of the first acoustic wave resonator; and
a second acoustic wave resonator including a second plurality of electrode fingers and having a second tilt angle that is an angle formed between a direction perpendicular to a direction in which the second plurality of electrode fingers of the second acoustic wave resonator extend and a direction along which the second plurality of electrode fingers are arranged, the second tilt angle being different from the first tilt angle.

2. The acoustic wave device of claim 1 wherein the second acoustic wave resonator is a parallel resonator connected to a parallel arm of the acoustic wave device, the power flow angle at the resonant frequency of the first acoustic wave resonator is higher than a power flow angle at an anti-resonant frequency of the second acoustic wave resonator, and the first tilt angle is higher than the second tilt angle.

3. The acoustic wave device of claim 2 further comprising a piezoelectric substrate having a cut angle with no symmetry in a crystal of the piezoelectric substrate about a wavefront propagation direction of the surface acoustic wave, the first and second acoustic wave resonators being formed on the piezoelectric substrate.

4. The acoustic wave device of claim 3 wherein the piezoelectric substrate is lithium niobate.

5. The acoustic wave device of claim 1 wherein
the second acoustic wave resonator is a parallel resonator connected to a parallel arm of the acoustic wave device, the power flow angle at the resonant frequency of the first acoustic wave resonator is lower than a power flow angle at an anti-resonant frequency of the second acoustic wave resonator, and the first tilt angle is lower than the second tilt angle.

6. The acoustic wave device of claim 5 further comprising a piezoelectric substrate having a cut angle of with no symmetry in a crystal of the piezoelectric substrate about a wavefront propagation direction of the surface acoustic wave, the first and second acoustic wave resonators being formed on the piezoelectric substrate.

7. The acoustic wave device of claim 6 wherein the piezoelectric substrate is lithium niobate.

8. The acoustic wave device of claim 1 wherein the second acoustic wave resonator is a series resonator connected to the series arm, the power flow angle at the resonant frequency of the first acoustic wave resonator is higher than a power flow angle at a resonant frequency of the second acoustic wave resonator, and the first tilt angle is higher than the second tilt angle.

9. An acoustic wave device comprising:
a first acoustic wave resonator including a first plurality of electrode fingers and having a first tilt angle that is an angle formed between a direction perpendicular to a direction in which the first plurality of electrode fingers extend and a direction along which the first plurality of electrode fingers are arranged, the first acoustic wave resonator being a parallel resonator connected to a parallel arm of the acoustic wave device; and
a second acoustic wave resonator including a second plurality of electrode fingers and having a second tilt angle that is an angle formed between a direction perpendicular to a direction in which the second plurality of electrode fingers extend and a direction along which the second plurality of electrode fingers are arranged, the second tilt angle being different from the first tilt angle, a resonant frequency of the first acoustic wave resonator being higher than a resonant frequency of the second acoustic wave resonator, and an absolute value of a difference between the first tilt angle and a power flow angle at the resonant frequency of the first acoustic wave resonator being smaller than an absolute value of a difference between the second tilt angle and a power flow angle at the resonant frequency of the second acoustic wave resonator.

10. An antenna duplexer comprising:
a first acoustic wave filter having a first frequency band as a pass band, the first acoustic wave filter including a first acoustic wave resonator connected to a series arm of the first acoustic wave filter and a second acoustic wave resonator connected to a parallel arm of the first acoustic wave filter; and
a second acoustic wave filter having, as a pass band, a second frequency band higher than the first frequency band,
an absolute value of a difference between a power flow angle at an anti-resonant frequency of the first acoustic wave resonator and a first tilt angle that is an angle formed between a direction perpendicular to a direction in which electrode fingers of the first acoustic wave resonator extend and a direction along which the electrode fingers are arranged being smaller than an absolute value of a difference between a power flow angle at a resonant frequency of the second acoustic wave resonator and a second tilt angle that is an angle formed between a direction perpendicular to a direction in which electrode fingers of the second acoustic wave resonator extend and a direction along which the electrode fingers are arranged.

11. The antenna duplexer of claim 10 wherein the second acoustic wave filter includes a third acoustic wave resonator connected to a series arm of the second acoustic wave filter and a fourth acoustic wave resonator connected to a parallel arm of the second acoustic wave filter.

12. An antenna duplexer comprising:
a first acoustic wave filter having a first frequency band as a pass band; and
a second acoustic wave filter having, as a pass band, a second frequency band higher than the first frequency band, the first acoustic wave filter being a reception filter which receives a signal, and including a plurality of first acoustic wave series resonators connected to a series arm of the first acoustic wave filter and a second acoustic wave resonator connected to a parallel arm of the first acoustic wave filter, and an absolute value of a difference between a power flow angle at a resonant frequency of a series resonator at an input-side first stage among the plurality of first series resonators and a first tilt angle that is an angle formed between a direction perpendicular to a direction in which electrode fingers of the series resonator at the input-side first stage extend and a direction along which the electrode fingers are arranged being smaller than an absolute value of a difference between a power flow angle at a resonant frequency of any one series resonator at a stage other than the input-side first stage among the plurality of first series resonators and a second tilt angle that is an angle formed between a direction perpendicular to a direction in which electrode fingers of said any one series resonator at the stage other than the input-side first stage extend and a direction along which the electrode fingers are arranged.

13. An antenna duplexer comprising:
a first acoustic wave filter having a first frequency band as a pass band; and
a second acoustic wave filter having, as a pass band, a second frequency band higher than the first frequency band, the second acoustic wave filter being a reception filter which receives a signal, and including a plurality of first acoustic wave series resonators connected to a series arm of the second acoustic wave filter and a second acoustic wave resonator connected to a parallel arm of the second acoustic wave filter, and an absolute value of a difference between a power flow angle at a resonant frequency of a series resonator at an input-side first stage among the plurality of first series resonators and a first tilt angle that is an angle formed between a direction perpendicular to a direction in which electrode fingers of the series resonator at the input-side first stage extend and a direction along which the electrode fingers are arranged being smaller than an absolute value of a difference between a power flow angle at a resonant frequency of any one series resonator at a stage other than the input-side first stage among the plurality of first series resonators and a second tilt angle that is an angle formed between a direction perpendicular to a direction in which electrode fingers of said any one series resonator at the stage other than the input-side first stage extend and a direction along which the electrode fingers are arranged.

14. An antenna duplexer comprising:
a first acoustic wave filter having a first frequency band as a pass band; and
a second acoustic wave filter having, as a pass band, a second frequency band higher than the first frequency band, the second acoustic wave filter including a first acoustic wave resonator connected to a series arm of the second acoustic wave filter and a second acoustic wave resonator connected to a parallel arm of the second acoustic wave filter, and an absolute value of a difference between a power flow angle at a resonant frequency of the second acoustic wave resonator and a first tilt angle that is an angle formed between a direction perpendicular to a direction in which electrode fingers of the second acoustic wave resonator extend and a direction along which the electrode fingers are arranged being smaller than an absolute value of a difference between a power flow angle at an anti-resonant frequency of the first acoustic wave resonator and a second tilt angle that is an angle formed between a direction perpendicular to a direction in which electrode fingers of the first acoustic wave resonator extend and a direction along which the electrode fingers are arranged.

15. The antenna duplexer of claim 14 wherein the first acoustic wave filter includes a third acoustic wave resonator connected to a series arm of the first acoustic wave filter and a fourth acoustic wave resonator connected to a parallel arm of the first acoustic wave filter.

16. An acoustic wave device comprising:
a first acoustic wave resonator including a first plurality of electrode fingers and having a first tilt angle that is an angle formed between a direction perpendicular to a direction in which the first plurality of electrode fingers extend and a direction along which the first plurality of electrode fingers are arranged; and
a second acoustic wave resonator including a second plurality of electrode fingers and having a second tilt angle that is an angle formed between a direction perpendicular to a direction in which the second plurality of electrode fingers of the second acoustic wave resonator extend and a direction along which the second electrode fingers are arranged, the second acoustic wave resonator being a parallel resonator connected to a parallel arm of the acoustic wave device, and the second tilt angle being different from the first tilt angle and within a range of ±1° from a power flow angle at an anti-resonant frequency of the second acoustic wave resonator.

17. The acoustic wave device of claim 16 wherein the first acoustic wave resonator is a parallel resonator connected to the parallel arm, a power flow angle at an anti-resonant frequency of the first acoustic wave resonator is lower than the power flow angle at the anti-resonant frequency of the second acoustic wave resonator, and the first tilt angle is lower than the second tilt angle.

18. The acoustic wave device of claim 16 wherein the first acoustic wave resonator is a series resonator connected to a series arm of the acoustic wave device, a power flow angle at a resonant frequency of the first acoustic wave resonator is higher than the power flow angle at the anti-resonant frequency of the second acoustic wave resonator, and the first tilt angle is higher than the second tilt angle.

19. The acoustic wave device of claim 16 wherein the first acoustic wave resonator is a series resonator connected to a series arm of the acoustic wave device, a power flow angle at a resonant frequency of the first acoustic wave resonator is lower than the power flow angle at the anti-resonant frequency of the second acoustic wave resonator, and the first tilt angle is lower than the second tilt angle.

20. An acoustic wave device comprising:
a first acoustic wave resonator including a first plurality of electrode fingers and having a first tilt angle that is an angle formed between a direction perpendicular to a direction in which the first plurality of electrode fingers extend and a direction along which the first plurality of electrode fingers are arranged, the first acoustic wave resonator being a series resonator connected to a series arm of the acoustic wave device; and
a second acoustic wave resonator including a second plurality of electrode fingers and having a second tilt angle that is an angle formed between a direction perpendicular to a direction in which the second plurality of electrode fingers extend and a direction along which the second plurality of electrode fingers are arranged, the second tilt angle being different from the first tilt angle, the second acoustic wave resonator being a series resonator connected to the series arm, an anti-resonant frequency of the first acoustic wave resonator being lower than an anti-resonant frequency of the second acoustic wave resonator, and an absolute value of a difference between the first tilt angle and a power flow angle at the anti-resonant frequency of the first acoustic wave resonator being smaller than an absolute value of a difference between the second tilt angle and a power flow angle at the anti-resonant frequency of the second acoustic wave resonator.

* * * * *